United States Patent
Lovseth (10) Patent No.: US 11,024,932 B1
(45) Date of Patent: Jun. 1, 2021

(54) TUNABLE FREQUENCY SELECTIVE LIMITER

(71) Applicant: Rockwell Collins, Inc., Cedar Rapids, IA (US)

(72) Inventor: Jonathan A. Lovseth, Marion, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 29 days.

(21) Appl. No.: 16/520,492

(22) Filed: Jul. 24, 2019

(51) Int. Cl.
| | |
|---|---|
| *H01P 1/218* | (2006.01) |
| *H01P 11/00* | (2006.01) |
| *H03G 11/00* | (2006.01) |
| *H01P 1/22* | (2006.01) |
| *H01P 1/23* | (2006.01) |
| *H01P 1/217* | (2006.01) |

(52) U.S. Cl.
CPC ............ *H01P 1/218* (2013.01); *H01P 1/217* (2013.01); *H01P 1/227* (2013.01); *H01P 1/23* (2013.01); *H01P 11/007* (2013.01); *H03G 11/006* (2013.01)

(58) Field of Classification Search
CPC .......... H01P 1/218; H01P 1/217; H01P 1/215; H01P 1/20; H01P 1/23; H01P 1/227; H03G 11/00; H03G 11/006
USPC ........... 333/17.2, 24.1, 202, 211, 81 A, 81 R
See application file for complete search history.

(56) References Cited

U.S. PATENT DOCUMENTS

| | | | | |
|---|---|---|---|---|
| 3,317,863 A | * | 5/1967 | Ngo ............... | H01P 1/23 333/81 R |
| 3,458,837 A | * | 7/1969 | Ngo ............... | H03H 1/00 333/205 |
| 3,696,312 A | * | 10/1972 | Kuhn .............. | H03H 9/38 333/24 R |

* cited by examiner

*Primary Examiner* — Stephen E. Jones
(74) *Attorney, Agent, or Firm* — Suiter Swantz pc llo (57) ABSTRACT

A tunable frequency selective limiter is disclosed. In one or more embodiments, the tunable frequency selective limiter includes a first electrically conductive path. The tunable frequency selective limiter also includes a ferrimagnetic layer disposed adjacent to the first electrically conductive path. The tunable frequency selective limiter further includes a second electrically conductive path coiled around the first electrically conductive path and the ferrimagnetic layer. An electromagnetic current transmitting through the second electrically conductive path produces a magnetic field coupled to the ferrimagnetic layer. The tunable frequency selective limiter further includes a dielectric layer, wherein the ferrimagnetic layer is disposed on the dielectric layer. The portions of the second electrically conductive path that are at the interface of the dielectric layer and the ferrimagnetic layer may be embedded into the dielectric layer or may be disposed on the surface of the dielectric layer.

14 Claims, 5 Drawing Sheets

TUNABLE FREQUENCY SELECTIVE LIMITER

BACKGROUND

Radio frequency (RF) limiters are devices that attenuate high power signals within a spectrum of radio frequencies. RF limiters are commonly seen in radio sensitive environments (e.g., aircraft radio systems) where RF limiters reduce high power signals coming from unwanted sources, such as from cell phones on an aircraft, or from interfering or jamming radio signals. By reducing high power signals, RF limiters also protect sensitive equipment (e.g., receivers) from damage.

Although traditional RF limiters (e.g., a diode limiter) protect circuits from damage, they may also reduce signals from smaller desired signals, resulting in a degraded signal to noise ratio. More recently, tunable notch filters have been devised that reduce power from a select range of frequencies. Tunable notch filters require external control from a digital system or mechanical actuators and are limited to attenuating one interfering signal range Magnetic frequency selective limiters are an improvement upon earlier tunable notch filters, as they use material properties to inherently provide a notch filter response for each signal that exceeds a power threshold. The notch filter response directly corresponds with how much the power exceeds the frequency selective limiter's power threshold. Magnetic frequency selective limiters do this without degrading signals at other frequencies over a wide range of frequencies. The frequency range of the notch and the power threshold is dependent on a magnetic field provided by a permanent magnet. Magnetic frequency selective limiters are limited in their implementation. Once created, the power threshold and frequency bandwidth in a magnetic frequency selective limiter cannot be adjusted. This can be problematic if both the desired signals and the interfering signals are below the power threshold of the magnetic frequency selective limiter, or if the frequency range of the interfering signals is just outside of the filter range. Consequently, there is a need for magnetic frequency selective limiter that is tunable (e.g., having an ability to adjust the frequency range of passband and attenuation and/or the power threshold).

Coupled with the need for a dynamically adjustable magnetic frequency selective limiter is the need for miniaturization of magnetic frequency selective limiter components. As RF electronic designs and design needs become more complex, RF electronic components also require a reduction in size, particularly in projects with size and weight constraints (e.g., drones, or earphones). The magnetic field of permanent magnets decreases nonlinearly with size, which can make the development of magnetic frequency selective limiters difficult. As device designs and system application needs require smaller magnetic frequency selective limiters with adjustment capabilities, there is a need for miniaturized devices that can dynamically limit RF signals.

SUMMARY

A tunable frequency selective limiter is disclosed. In one or more embodiments, the tunable frequency selective limiter includes a first electrically conductive path. The tunable frequency selective limiter also includes a ferrimagnetic layer disposed adjacent to the first electrically conductive path. The tunable frequency selective limiter further includes a second electrically conductive path coiled around the first electrically conductive path and the ferrimagnetic layer. An electromagnetic current conducted through the second electrically conductive path produces a magnetic field coupled to the ferrimagnetic layer. The tunable frequency selective limiter further includes a dielectric layer, wherein the ferrimagnetic layer is disposed on the dielectric layer. The portions of the second electrically conductive path that are at the interface of the dielectric layer and the ferrimagnetic layer may be embedded into the dielectric layer or may be disposed on the surface of the dielectric layer.

In some embodiments of the tunable frequency selective limiter, the tunable frequency selective layer further includes a permanent magnet. The permanent magnet is further configured to set a fixed magnetic bias on the tunable frequency selective tuner.

In some embodiments of the tunable frequency selective limiter, the frequency tunable characteristic and/or the bandwidth tunable characteristic of the tunable frequency selective limiter may be further configured by a change in the electromagnetic current running through the second conductive path.

In some embodiments of the tunable frequency selective limiter, the second conductive path is comprised of an electrophoretically deposited metal.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

Broadly, embodiments of the disclosure are directed to a tunable frequency selective limiter. Radio frequency (RF) limiters are devices that attenuate high power signals within a spectrum of radio frequencies. RF limiters reduce unwanted RF signals (e.g., jamming RF signals) and protect sensitive RF equipment (e.g., receivers) from damage. Traditional RF limiters (e.g., diode limiters) attenuate high power signals, but typically are unable to selectively dampen unwanted high-power signals from desired low power signals. Notch filters can selectively dampen a small range of frequencies (e.g., 58-62 MHz), but are limited to the one range. Magnetic frequency selective limiters have been developed that can dampen signals above a power threshold (Pin) over a wide frequency range. However, the power threshold and the frequency range are permanently set by the permanent magnet used for coupling the magnetic field to the ferrimagnetic layer of the frequency selective limiter. Changing the power threshold or the frequency range of the magnetic frequency selective limiter would require changing the permanent magnet within the magnetic frequency selective limiter or swapping the magnetic frequency selective limiter with a different magnetic frequency selective limiter with different power threshold and frequency range characteristics. Current magnetic frequency selective limiters are also limited by size, as the magnetic field of permanent magnets decreases nonlinearly with size, which can make the development of microscale magnetic frequency selective limiters difficult. Consequently, there is a need for a magnetic strain gauge that is tunable (e.g., adjusts to different frequency ranges and power thresholds) and capable of microscale production. A tunable frequency selective limiter capable of microscale implementation is disclosed herein and is described with reference to example embodiments illustrated in FIGS. 1 through 5.

Figure 1:
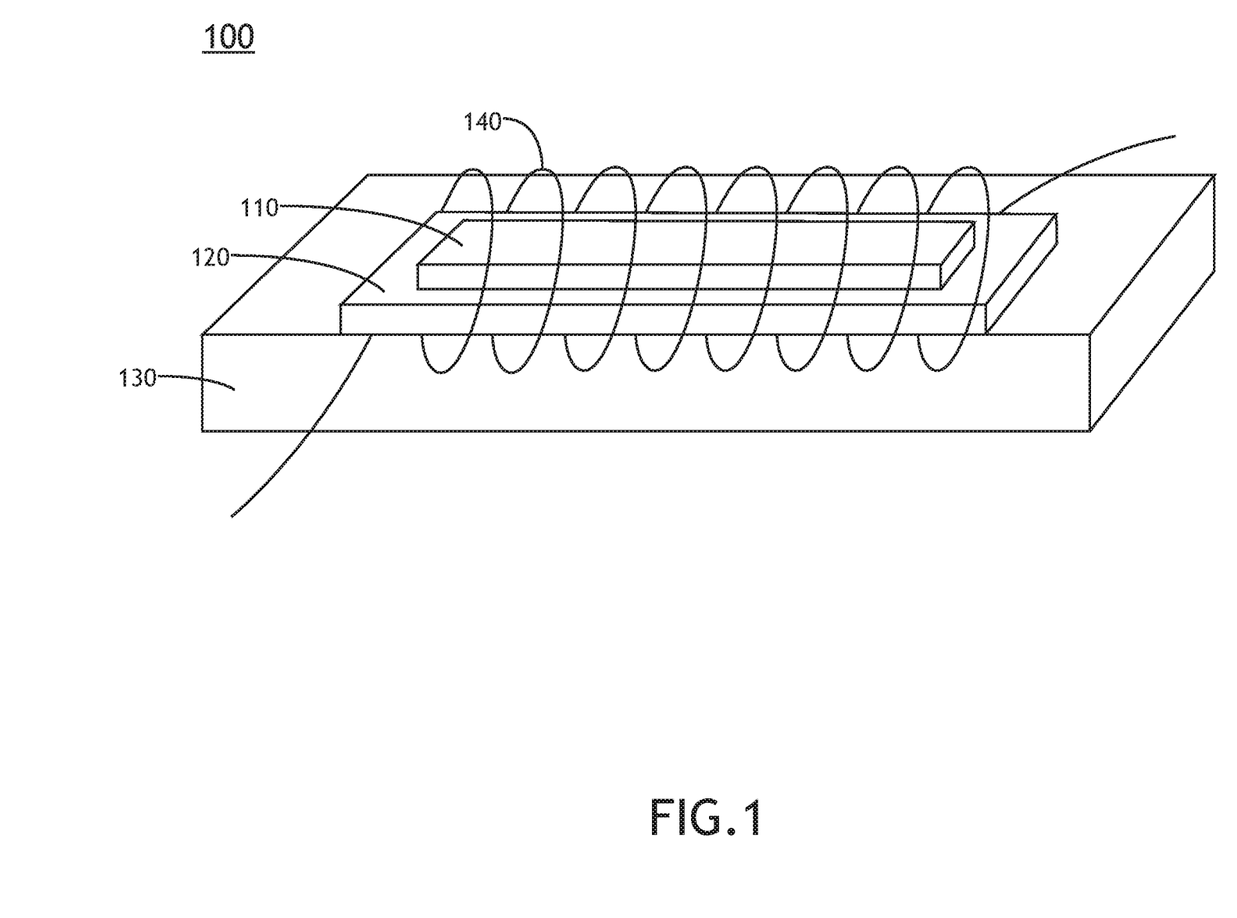
FIG. 1 is a perspective view of a tunable frequency selective limiter, in accordance with one or more embodiments of this disclosure.

FIG. 1 is a diagram illustrating a tunable frequency selective limiter 100, in accordance with one or more embodiments of this disclosure. In some embodiments, the tunable frequency selective limiter 100 includes a first electrically conductive path 110. The first electrically conductive path 110 allows the RF signal to transmit across the tunable frequency selective limiter 100. The first electrically conductive path 110 may take the form of any conductor of a transmission line known in the art capable of transmitting an RF signal including but not limited to the conductor of a stripline, microstrip, coaxial cable, or parallel line. The first electrically conductive path 110 may be formed of any material known in the art to form the conductor of a transmission line including but not limited to copper, silver, nickel, aluminum and gold. The first electrically conductive path 100 must also have an adequate peripheral surface that will allow transmission of the RF signal, at the desired characteristic impedance (Zo). To some extent, the adequate peripheral surface of the first conductive path 100 may be fabricated by adjusting the depth of the first conductive path. For instance, the first conductive path 110 may have a depth ranging from 0.5 µm to 0.2 mm. In another instance, the first conductive path may have a depth ranging from 40 µm to 150 µm.

The tunable frequency selective limiter 100 also includes a ferrimagnetic layer 120, which the first electrically conductive path 110 is disposed upon. The ferrimagnetic layer 120 acts upon RF currents transmitting across the first electrically conductive path 110, selectively attenuating the RF signals that transmit across the first electrically conductive path 110 that are of a specific threshold. The ferrimagnetic layer 120 may be of any ferrimagnetic material known in the art to selectively attenuate RF signals, including but not limited to yttrium iron garnet (YIG) and magnetite ($Fe_3O_4$). The ferrimagnetic layer 120 may be of any shape known in the art to be used in an RF limiter, including but not limited to a sphere, a cylinder (e.g., a rod), or a deposited layer (e.g., a film). In some embodiments, the ferrimagnetic material is a YIG film (e.g., an epitaxial film grown on a gadolinium gallium garnet substrate). In some embodiments, the ferrimagnetic material is a YIG crystal.

The tunable frequency selective limiter 100 also includes a dielectric layer 130, which the ferrimagnetic layer 120 is disposed upon. The dielectric layer 130 acts as an insulator, supporting the flow of RF current along the first electrically conductive path 110 while itself not acting as a conductor. The dielectric layer 130 may also act as an attachment material, allowing the tunable frequency selective limiter 100 to attach to a substrate (e.g., a wafer or die). The dielectric layer 130 may be made out of any material known in the art to be used as a dielectric material in electronics, including but not limited to ceramics, mica, glass, plastic, silicon nitride and silicon dioxide.

The tunable frequency selective limiter 100 also includes a second electrically conductive path 140. The second electrically conductive path 140 is a coil that wraps around the first conductive path 110 and the ferrimagnetic layer 120. Direct current running through the second electrically conductive path 140 produces a magnetic field which is then coupled to the ferrimagnetic layer 120. The magnetic field alters the ability of the ferrimagnetic layer to attenuate the RF signal. For instance, the magnetic field may alter the center of the range of frequencies for which signals will be attenuated by the tunable frequency selective limiter 100 if a threshold is reached. In another instance, the magnetic field may increase the power threshold of the tunable frequency selective limiter 100. Because the ferrimagnetic layer 120 is disposed on the dielectric layer 120 and the second conductive path 140 is coiled around the ferrimagnetic layer 120, the interface between the dielectric layer 130 and the ferrimagnetic layer also contains a portion of the second electrically conductive path 140. This interface portion of the second conductive path 140 may be embedded into the dielectric layer 130, aiding to securing the tunable frequency selective limiter 100 to the substrate. In another instance, the interface portion of the conductive path may be disposed upon the dielectric layer 130.

The second electrically conductive path 140 may be constructed of any conductive material known in the art for producing a magnetic field. For instance, the second electrically conductive path 140 may be a wire (e.g., copper, gold, or platinum). In another instance, the second electrically conductive path 140 may be a conductive material that is electrodeposited onto a substrate. In this case, the interface portion of the second electrically conductive path 140 is first electrodeposited on or into the dielectric layer 130. Next, the ferrimagnetic layer 120 and the first electrically conductive path 110 is deposited on top of the deposited portion of the second electrically conductive path 140. Finally, the non-interface portion of the second electrically conductive path 140 is electrodeposited, creating a coil.

Portions of the tunable frequency selective limiter 100 (e.g., the first electrically conductive path 110 or the second electrically conductive path 140) may be constructed via a fabrication process that allows the tunable frequency selective limiter 100 to have substantially smaller dimensions than traditional limiters. For instance, the tunable selective limiters may be constructed via microfabrication process (e.g., PolyStrata™ EFAB, or Z-Fab).

The second electrically conductive path 140 carries the current required to form an adequate magnetic field for the tunable frequency selective limiter 100. The current can be direct current, alternating current, or contain a modulated waveform. The second electrically conductive path 140 should be of an appropriate thickness to carry the required current (e.g., greater than one mA) through the second electrically conductive path 140 to create the magnetic field. For some embodiments, the cross-sectional area of the second electrically conductive path 140 is greater than 10,000 $\mu m^2$. For some embodiments, the cross-sectional area of the second electrically conductive path 140 is between 100 and 10,000 $\mu m^2$. In some embodiments, the second electrically conductive path 140 is approximately 4,225 $\mu m^2$. In some embodiments, the thickness of the second electrically conductive path 140 (e.g., along an X, Y, or Z direction) is between 10 $\mu m$ and 500 $\mu m$. In some embodiments, the thickness of the second electrically conductive path is between 40 $\mu m$ and 150 $\mu m$. It should be noted that some microfabrication processes (e.g., Z-Fab) are capable of layering substrates (e.g., conductive materials), creating conductive paths with dimensions substantially larger than the ranges described above. Therefore, the above description should not be interpreted as a limitation on the present disclosure, but merely an illustration.

Figure 2:
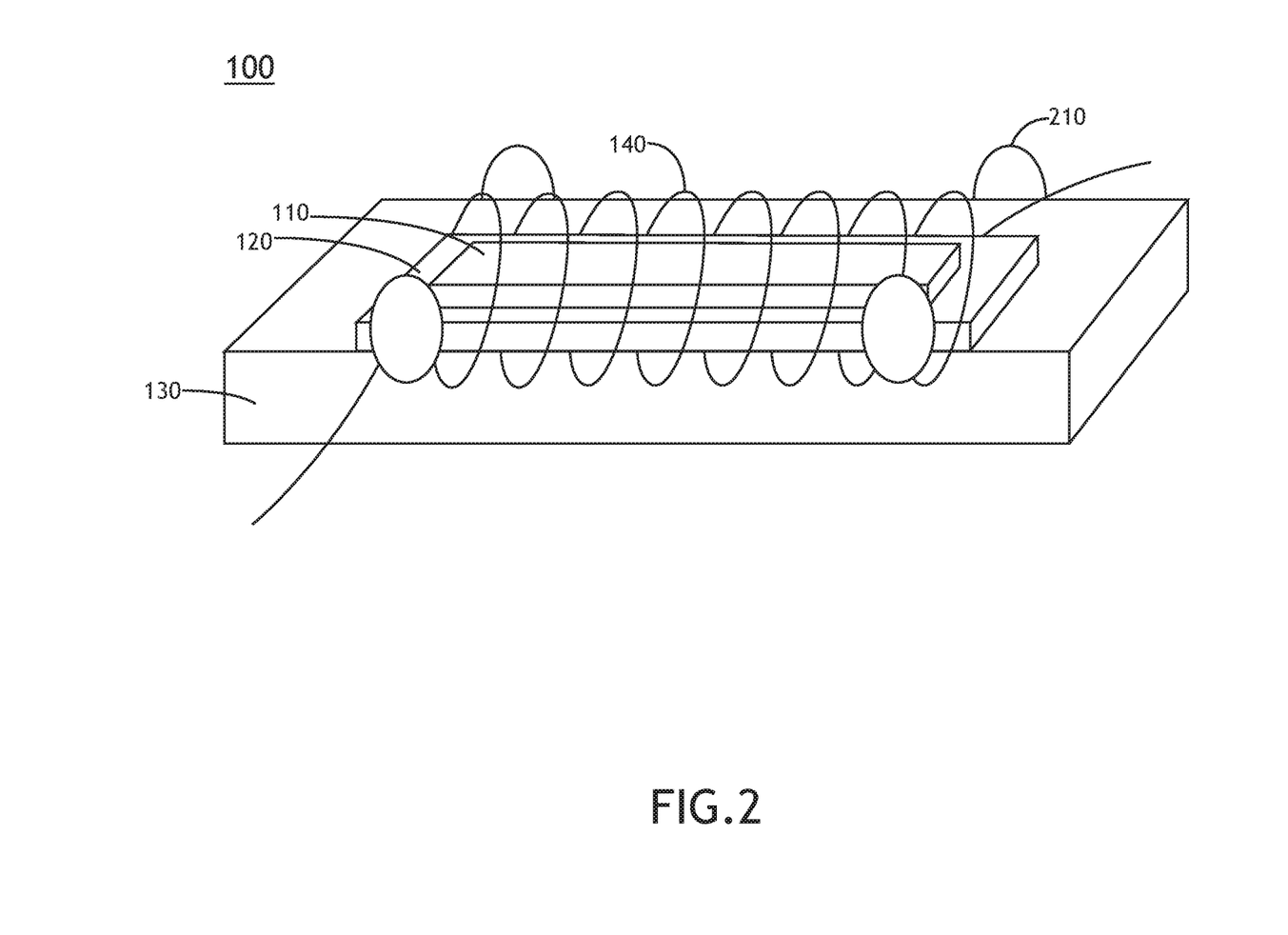
FIG. 2 is a perspective view of a tunable frequency selective limiter, further including a set of magnets, in accordance with one or more embodiments of this disclosure.

FIG. 2 is a diagram illustrating a tunable frequency selective limiter 100, further configured to include a set of permanent magnets 210, in accordance with one or more embodiments of this disclosure. The permanent magnets 210 modulates onto the power threshold and/or frequency range of the tunable frequency selective limiter 100. The fixed modulation produced by the permanent magnets 210 reduces the amount of magnetic field needed from flowing current through the second electrically conductive path 140, resulting in a power savings. The permanent magnets 210 may be of any type of permanent magnet known in the art, including but not limited to rare earth magnets, neodymium magnets, samarium cobalt magnets, alnico magnets, and ceramic magnets.

Figure 3:
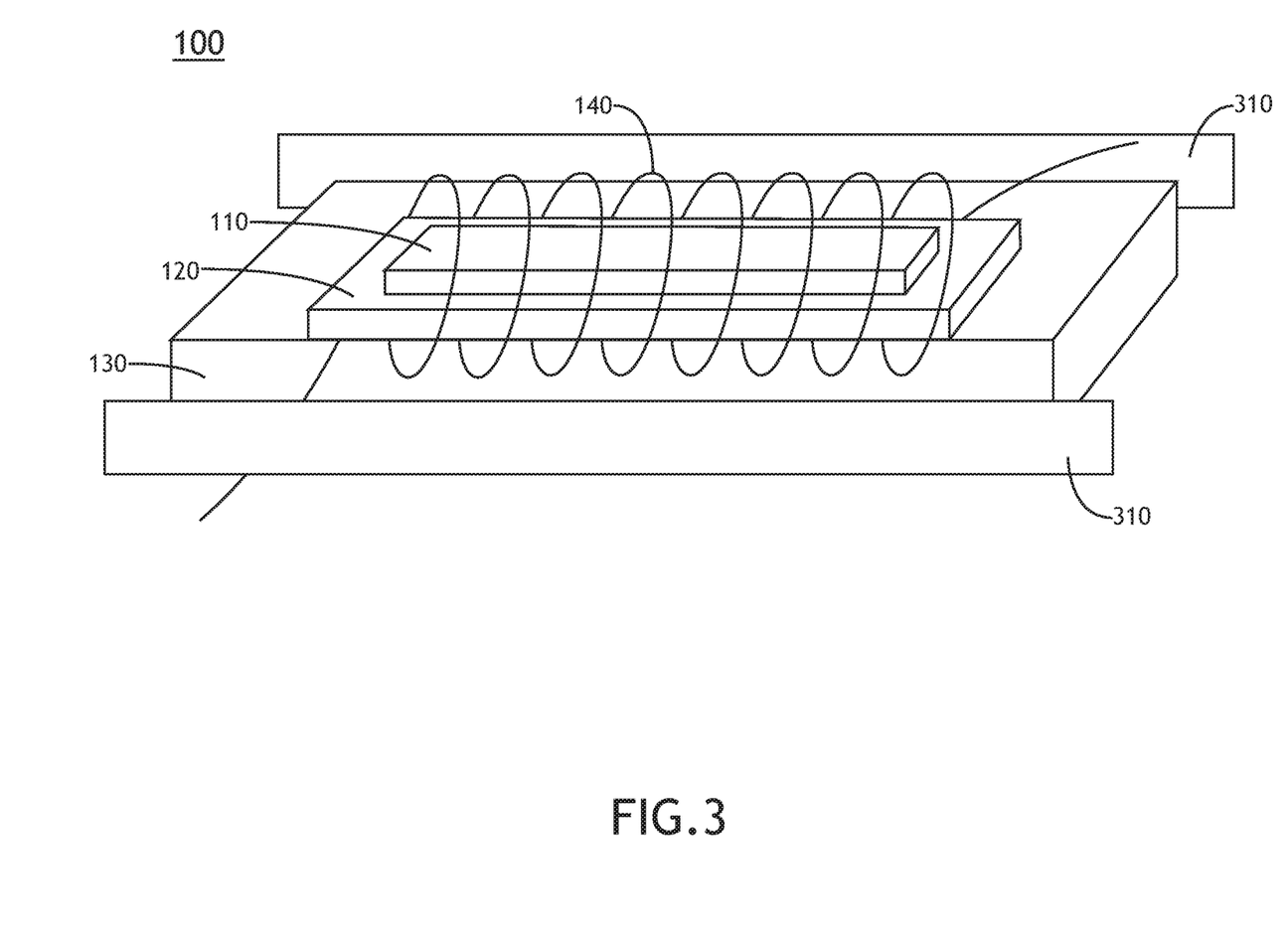
FIG. 3 is a perspective view of a tunable frequency selective limiter, further including a heat sink, in accordance with one or more embodiments of this disclosure.

FIG. 3 is a diagram illustrating a tunable frequency selective limiter 100, further configured to include a heat sink 310, in accordance with one or more embodiments of this disclosure. Heat sinks 310 are passive heat exchangers that transfer heat generated by electronic circuits to the outside environment (e.g., air), allowing the circuit to maintain function without overheating. RF current flowing through the first electrically conductive path 110 and direct current flowing through the second electrically conductive path 140 generate heat that must be dissipated from the tunable frequency selective limiter 100 to prevent damage. The heat sink 310 can be made of any material with high thermal conductivity known in the art to be used in a heat sink, including but not limited to copper, gold, or aluminum. The heat sink may be disposed on at least one side of the tunable frequency selective limiter 100 (e.g., two sides as in FIG. 3), and can surround the tunable frequency selective limiter 100. The heat sink 310 may also be deposited underneath the tunable frequency selective limiter 100. For instance, a pocket in the substrate (e.g., a wafer or die), may be excavated and lined on the bottom of the pocket and all four sides with heat sink material. The tunable frequency selective limiter 100 is then laid within the pocket, effectively surrounded by the heat sink 310.

Figure 4:
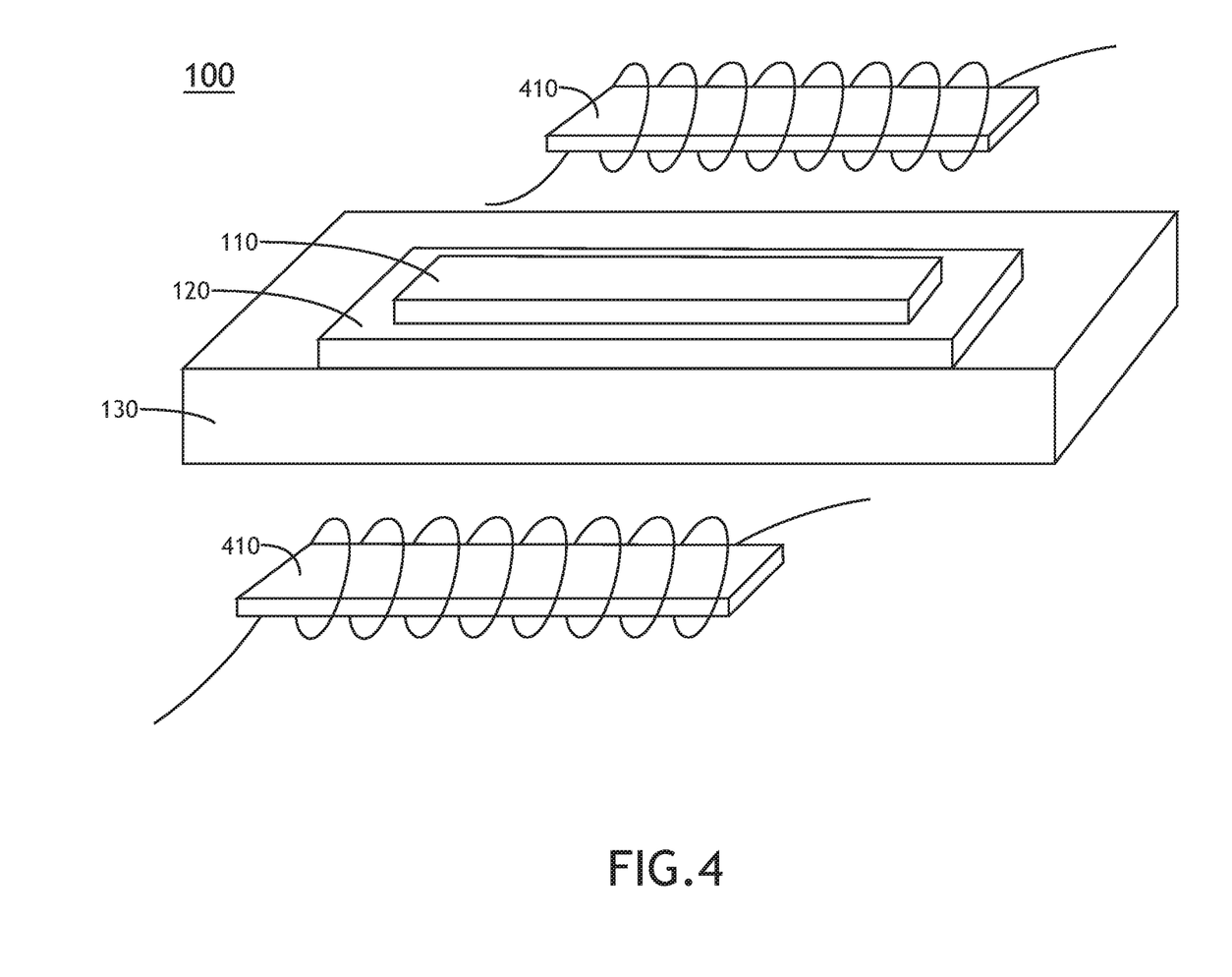
FIG. 4 is a perspective view of a tunable frequency selective limiter, with the second conductive pathway removed and two electromagnets placed parallel to the tunable frequency conductive pathway, in accordance with one or more embodiments of this disclosure.

FIG. 4 is a diagram illustrating a tunable frequency selective limiter 100, with the second electrically conductive path 140 removed and two electromagnets 410 placed parallel to the tunable frequency conductive pathway, in accordance with one or more embodiments of this disclosure. Electromagnets 410 implemented adjacent and substantially near the tunable frequency selective limiter 100 can modulate the frequency bias and the power threshold of the tunable frequency selective limiter 100, similar to permanent magnets 210, and have the advantage of having an adjustable magnetic field, similar to the second electrically conductive path 140. Adjacent electromagnets 410 may also have an advantage over the second electrically conductive path 140, as the electromagnet design can be optimized for the force of the magnetic field without concern for placement or function of the first electrically conductive path 110 or the ferrimagnetic layer 120.

The electromagnet 410 further includes a metal coil wrapped around a magnetic core. The magnetic core may be made of any ferromagnetic or ferrimagnetic material known in the art to comprise a magnetic core, including but not limited to iron, ferrite ceramics, and molypermalloy. The coil may be formed of any type of wire or deposited metal capable for use in an electromagnet, including but not limited to copper, iron, silver and platinum. In some embodiments, one electromagnet 410 is disposed adjacent to the tunable frequency selective limiter 100. However, multiple electromagnets may be disposed adjacent to the tunable frequency selective limiter 100. Therefore, the embodiment disclosed herein should not be considered as limiting. Adjustment of the current through the one or more electromagnets 410 modulates the frequency bias and/or the power threshold of the tunable frequency selective limiter 100.

Figure 5:
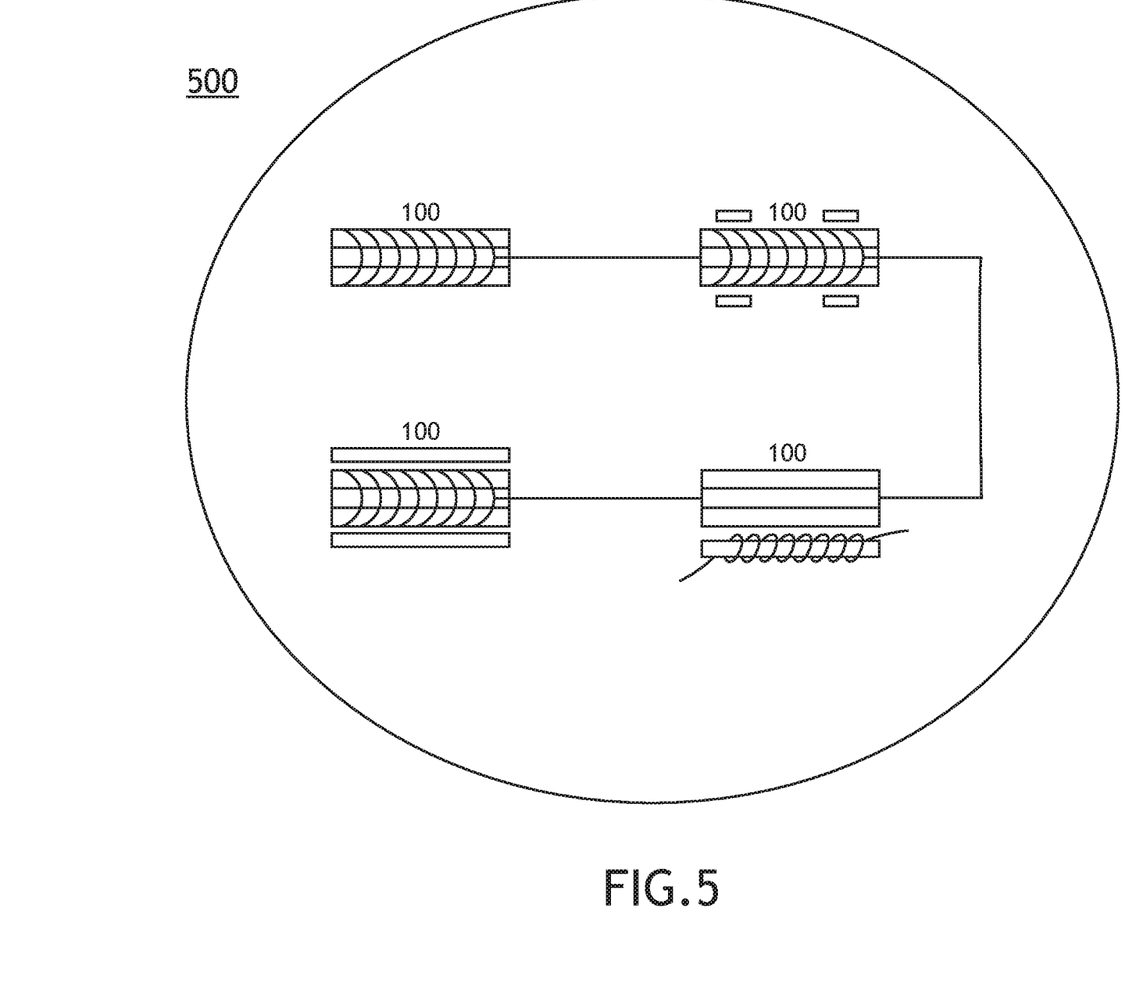
FIG. 5 is a diagram illustrating a top view of an example implementation of the tunable frequency selective limiter on a wafer, in accordance with one or more embodiments of this disclosure.

FIG. 5 is a diagram illustrating a top view of an example implementation of the tunable frequency selective limiter 100 on a wafer 500, in accordance with one or more embodiments of this disclosure. In some embodiments, the tunable frequency selective limiter 100 is fashioned in a miniaturized scale onto very small or very thin substrates (e.g., a semiconductor wafer 500) in a sequential patterning deposition process that allows the electrical features of the tunable frequency selective limiter 100 (e.g., the second electrically conductive path 140) to be formed into a three-dimensional final structure. Multiple tunable frequency selective limiters 100 can be fabricated onto a single wafer 500 or die along with other miniaturized components. The fabricated tunable frequency selective limiters 100 may also include other components described herein (e.g., permanent magnets 210, heat sinks 310, or adjacent electromagnets 410). In some embodiments, the electrical features are formed by more traditional technologies (e.g., the second electrically conductive path 140 may be formed from a wire). It should be noted that the multiple tunable frequency selective limiters 100 fashioned onto the wafer in FIG. 5 are not to scale. Therefore, the embodiments of the disclosure herein should not be considered limiting.

It should be noted that the tunable frequency selective limiter may contain any combination or number of components described herein (e.g., (e.g., permanent magnets 210, heat sinks 310, or adjacent electromagnets 410). Therefore, the above description should not be interpreted as a limitation of the present disclosure, but merely an illustration.

In some embodiments, the tunable frequency selective limiter 100 further comprises a ground plane conductor (although not shown). A ground plane conductor is a conducting surface that serves as a return path for current from electrical components. The ground plane conductor also may act as a heat sink. Ground plane conductors would be typically used for tunable frequency selective limiters 100 that are configured for use on printed circuit boards or other large-scale electronic devices.

In some embodiments, the tunable frequency limiter 100 is further configured to discharge plasma upon reaching a specific power threshold (although not shown). Magnetic frequency selective limiters attenuate signals within a specified power range. If the RF limiter receives an RF signal greater the specified power range, the RF limiter saturates, and excess RF signal will pass through, potentially damaging downstream electronic components. To counteract this problem, a shunting conductor may be placed close to the first electrically conductive path 110 and upstream of the ferrimagnetic layer 120 to induce inductive coupling. Here, a portion of the RF current will flow towards the shunting conductor (e.g., in the form of a plasma) whereas the remaining RF current will transmit through the first electrically conductive path 110. For instance, if a RF signal is traversing towards through the tunable frequency limiter 100 with a power of 1.2 watts, and the downstream receiver is rated for a maximum of 1.0 watts, then a shunting conductor (e.g., a wire or conductive path) may be fashioned close enough to the first electrically conductive path 110 so that the shunting conductor will induce 0.2 watts of power from the original RF signal to couple to the shunting conductor, allowing the receiver to receive only 1.0 watts of RF signal. The amount of inductive coupling between two conductors can be effectively controlled through precise placement of the conductors through sequential patterning deposition processes (e.g., Z-Fab). Once shunted to the shunting conductor, the shunted energy may be further transmitted (e.g., reflected as a mismatched characteristic impedance) to the substrate 130, the second electrically conductive path 140, or some other substrate capable of conducting the shunted energy.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A tunable frequency selective limiter; comprising:
a first electrically conductive path;
a ferrimagnetic layer disposed adjacent to the first electrically conductive path;
a second electrically conductive path coiled around the first electrically conductive path and the ferrimagnetic layer, wherein electromagnetic current transmitting through the second electrically conductive path produces a magnetic field coupled to the ferrimagnetic layer;
a dielectric layer, wherein the ferrimagnetic layer is disposed on the dielectric layer, wherein portions of the second electrically conductive path at an interface of the dielectric layer and the ferrimagnetic layer are at least one of embedded into the dielectric layer or disposed on a surface of the dielectric layer.

2. The tunable frequency selective limiter of claim 1, further comprising at least one permanent magnet, wherein the at least one permanent magnet is configured to set a magnetic bias on the tunable frequency selective limiter.

3. The tunable frequency selective limiter of claim 1, wherein the first electrically conductive path is further configured to discharge plasma upon reaching a specific power threshold.

4. The tunable frequency selective limiter of claim 1, wherein at least one of a frequency tunable characteristic or a bandwidth tunable characteristic of the tunable frequency selective limiter may be altered by a change in the electromagnetic current through the second conductive path.

5. The tunable frequency selective limiter of claim 1, wherein the tunable frequency selective limiter is fabricated on a wafer.

6. The tunable frequency selective limiter of claim 1, wherein a depth of the first electrically conductive path is between 0.5 µm and 0.2 mm.

7. The tunable frequency selective limiter of claim 1, wherein a cross-sectional area of the second electrically conductive path is between 100 and 10,000 µm2.

8. The tunable frequency selective limiter of claim 1, wherein the second electrically conductive path is comprised of an electrophoretically deposited metal.

9. The tunable frequency selective limiter of claim 1, wherein the second electrically conductive path is comprised of a wire.

10. The tunable frequency selective limiter of claim 1, further comprising a metal layer disposed on a least one side of the tunable frequency selective limiter, wherein the metal is configured to dissipate heat from the tunable frequency selective limiter.

11. The tunable frequency selective limiter of claim 1, further comprising at least one ground plane conductor.

12. The tunable frequency selective limiter of claim 1, wherein the ferrimagnetic layer comprises yttrium iron garnet.

13. The tunable frequency selective limiter of claim 12, wherein the yttrium iron garnet is an epitaxial grown film.

14. The tunable frequency selective limiter of claim 12, wherein the yttrium iron garnet is a crystal.

* * * * *